(12) United States Patent
Liu (10) Patent No.: US 7,427,362 B2
(45) Date of Patent: Sep. 23, 2008

(54) CORROSION-RESISTANT BARRIER POLISHING SOLUTION

(75) Inventor: Zhendong Liu, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 11/044,769

(22) Filed: Jan. 26, 2005

(65) Prior Publication Data

US 2006/0163530 A1     Jul. 27, 2006

(51) Int. Cl.
*C09K 5/00* (2006.01)

(52) U.S. Cl. ............... 252/79.1; 252/79.2; 252/79.3; 252/79.4

(58) Field of Classification Search .............. 252/79.1, 252/79.2, 79.3, 79.4; 216/88, 89; 438/692, 438/693
See application file for complete search history.

(56) References Cited

U.S. PATENT DOCUMENTS

| | | | | |
|---|---|---|---|---|
| 6,063,306 | A * | 5/2000 | Kaufman et al. ........... | 252/79.4 |
| 6,083,840 | A | 7/2000 | Mravic et al. | |
| 6,117,775 | A | 9/2000 | Kondo et al. | |
| 6,194,317 | B1 | 2/2001 | Kaisaki et al. | |
| 6,375,693 | B1 | 4/2002 | Cote et al. | |
| 6,409,781 | B1 | 6/2002 | Wojtczak et al. | |
| 6,436,811 | B1 | 8/2002 | Wake et al. | |
| 6,447,563 | B1 | 9/2002 | Mahulikar | |
| 6,562,719 | B2 * | 5/2003 | Kondo et al. ............... | 438/691 |
| 6,638,326 | B2 * | 10/2003 | Small et al. ............... | 51/307 |
| 6,679,929 | B2 * | 1/2004 | Asano et al. ............... | 51/308 |
| 6,692,546 | B2 * | 2/2004 | Ma et al. ................... | 51/298 |
| 6,723,691 | B2 * | 4/2004 | Naghshineh et al. ........ | 510/175 |
| 2003/0131535 | A1 | 7/2003 | Small et al. | |
| 2004/0009671 | A1 | 1/2004 | Kaufman et al. | |
| 2004/0108302 | A1 * | 6/2004 | Liu et al. ................... | 216/83 |
| 2004/0147118 | A1 | 7/2004 | Liu et al. | |
| 2005/0029491 | A1 | 2/2005 | Liu | |
| 2005/0031789 | A1 * | 2/2005 | Liu et al. ................... | 427/340 |
| 2005/0066585 | A1 * | 3/2005 | Bian et al. ................. | 51/307 |
| 2005/0090104 | A1 | 4/2005 | Yang et al. | |

FOREIGN PATENT DOCUMENTS

| | | |
|---|---|---|
| EP | 1 229 093 B1 | 7/2002 |
| JP | 2000-336345 | * 12/2000 |
| JP | 2003-138248 | * 5/2003 |
| JP | 2003-303791 | * 10/2003 |
| WO | WO 00/00567 A1 | 1/2000 |
| WO | WO 01/95381 A2 | 12/2001 |

* cited by examiner

*Primary Examiner*—George A. Goudreau
(74) *Attorney, Agent, or Firm*—Blake T. Biederman (57) ABSTRACT

The polishing solution is useful for removing barrier materials in the presence of at least one nonferrous interconnect metal with limited erosion of dielectrics. The polishing solution contains 0 to 20 weight percent oxidizer, at least 0.001 weight percent inhibitor for reducing removal rate of the nonferrous interconnect metals, 0.0005 to 5 weight percent of at least one nonferrous accelerator selected from the group of a complexing agent for complexing the nonferrous metal and a water-soluble polymer containing an acrylic acid functional group and having a number average molecular weight of 100 to 1,000,000, 0 to 50 weight percent abrasive and balance water at a pH less than 7.

9 Claims, 2 Drawing Sheets

CORROSION-RESISTANT BARRIER POLISHING SOLUTION

BACKGROUND OF THE INVENTION

The invention relates to chemical mechanical planarizing (CMP) formulations for removing barrier metals and, more particularly, to polishing compositions for selectively removing barrier metals in the presence of interconnect structures in integrated circuit devices.

In recent years, the semiconductor industry has increasingly relied upon copper electrical interconnects in forming integrated circuits. These copper interconnects have a low electrical resistivity and a high resistance to electromigration. Since copper is very soluble in many dielectric materials, such as silicon dioxide and low-K or doped versions of silicon dioxide, a diffusion barrier layer is necessary to prevent the diffusion of copper into the underlying dielectric material. Typical barrier materials include, tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides.

In response to increasing demands for high density integrated circuits, semiconductor producers now fabricate integrated circuits containing multiple overlying layers of metal interconnect structures. During device fabrication, planarizing each interconnect layer improves packing density, process uniformity, product quality and most importantly, enables manufacturing of multiple layer integrated circuits. Semiconductor producers rely upon chemical-mechanical-planarizing (CMP) as a cost effective means of producing flat substrate surfaces. The CMP process is typically carried out in a two-step sequence. First, the polishing process uses a "first-step" slurry specifically designed to rapidly remove copper. For example, Carpio et al., in "Initial Study on Copper CMP Slurry Chemistries" Thin Solid Films, 262 (1995), disclose the use on a 5 weight percent nitric acid solution for efficient copper removal.

After the initial copper removal, a "second-step" slurry removes the barrier material. Typically, second-step slurries require excellent selectivity to remove the barrier material without adversely impacting the physical structure or electrical properties of the interconnect structure.

Tunability of the copper and dielectric rates in the barrier polishing step is important. Because integration schemes used by different IC manufacturers vary; the rate selectivity required for the various films polished in the barrier CMP step also varies. Certain film stacks require higher copper and dielectric rates for topography correction; but on other occasions, low copper and dielectric rates reduce the total metal loss and reduce the interconnect resistance. In alkaline slurries, increasing oxidizer concentration increases the copper removal rate. Because copper forms protective oxide at alkaline pH levels, excessive copper corrosion is not a concern for these slurries. For acidic barrier slurries, this approach can cause copper corrosion problems even with excessive amounts of BTA added.

For example, Liu et al. in US Pat. Pub. No. 2004/0147118, disclose an acidic barrier slurry. This slurry provides the advantage of excellent barrier removal rate with low copper rate at acidic pH levels. In these slurries, the hydrogen peroxide level provides an effective toggle for controlling copper removal rate. Unfortunately, it has been discovered that pitting corrosion can occur when hydrogen peroxide levels become too high.

In view of the above, there exists a need to provide a second-step slurry that possesses a high removal rate of barrier materials, excellent selectivity to interconnect metals, controlled removal of dielectric materials with controlled copper removal rate without the detrimental effects of copper pitting corrosion.

STATEMENT OF THE INVENTION

The invention provides a polishing solution useful for removing barrier materials in the presence of at least one nonferrous interconnect metal with limited erosion of dielectrics comprising: 0 to 20 weight percent oxidizer, at least 0.001 weight percent inhibitor for reducing removal rate of the nonferrous interconnect metals, 0.0005 to 5 weight percent of at least one nonferrous accelerator selected from the group of a complexing agent for complexing the nonferrous metal and a water-soluble polymer containing an acrylic acid functional group and having a number average molecular weight of 100 to 1,000,000, 0 to 50 weight percent abrasive and balance water; and the solution having a pH of less than 7.

In another aspect, the invention provides a polishing solution useful for removing barrier materials in the presence of at least one nonferrous interconnect metal with limited erosion of dielectrics comprising: 0.001 to 15 weight percent oxidizer, at least 0.001 weight percent inhibitor for reducing removal rate of the nonferrous interconnect metals, 0.001 to 3 weight percent of a water-soluble polymer containing an acrylic acid functional group and the water-soluble polymer being at least one of polyacrylic acid, polymethacrylic acid, copolymers thereof and mixtures thereof and having a number average molecular weight of 100 to 750,000, 1 ppm to 4 weight percent organic-containing ammonium salt formed with wherein $R_1$, $R_2$, $R_3$ and $R_4$ are radicals, $R_1$ has a carbon chain length of 2 to 15 carbon atoms. 0 to 50 weight percent abrasive and balance water; and the solution having a pH of less than 5.

In another aspect, the invention provides a method of polishing semiconductor substrates, including the step of: polishing the semiconductor substrate with a polishing solution and a polishing pad, the polishing solution useful for removing barrier materials in the presence of at least one nonferrous interconnect metal with limited erosion of dielectrics comprising: 0 to 20 weight percent oxidizer, at least 0.001 weight percent inhibitor for reducing removal rate of the nonferrous interconnect metals, 0.0005 to 5 weight percent of at least one nonferrous accelerator selected from the group of a complexing agent for complexing the nonferrous metal and a water-soluble polymer containing an acrylic acid functional group and having a number average molecular weight of 100 to 1,000,000, 0 to 50 weight percent abrasive and balance water; and the solution having a pH of less than 7.

DETAILED DESCRIPTION

It has been discovered that complexing agents and acrylic acid group polymers can improve acidic barrier removal solutions without adversely affecting wafer uniformity, TEOS removal rate or the selective removal of barrier films in patterned wafers. For purposes of this specification, complexing agents represent constituents that bond with nonferrous metal ions, act as chelating agents or otherwise associate with free metal ions to decrease the nonferrous metal ion concentration to accelerate copper removal rate of the polishing solution. In addition, low molecular weight polymers containing an acrylic acid functional group also promote copper removal rate. For purposes of the specification, polishing solution refers to aqueous polishing solutions that may or may not include abrasives. If the polishing solution includes an abrasive, then the polishing solution also is a polishing slurry. The polishing solution can also optionally include surfactants, pH buffers, defoaming agents and biocides.

For purposes of this specification, dielectric includes silica-base materials such as TEOS, low-k and ultra-low-k materials (some ultra-low materials are not silica-base). To polish low-k and ultra-low-k dielectric materials, it is important to maintain low pressure to decrease the delamination and fracture of these materials. However, low pressure yields low barrier material (Ta/TaN) removal rate, which is undesirable for wafer throughput. Fortunately, acidic polishing solutions having a strong oxidizer have demonstrated high barrier removal rates in comparison to conventional alkaline barrier slurries that operate at low pressures. The barrier material may include the following: tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides.

The solution contains 0.0005 to 5 weight percent of at least one nonferrous accelerator selected from the group of a complexing agent for complexing the nonferrous metal and a water-soluble polymer containing an acrylic acid functional group. Unless specifically expressed otherwise, this specification defines all solution ingredients in terms of weight percent. Preferably, the solution contains 0.001 to 3 weight percent of at least one nonferrous accelerator selected from the group of a complexing agent for complexing the nonferrous metal and a water-soluble polymer containing an acrylic acid functional group. Most preferably, the solution contains 0.002 to 2 weight percent of at least one nonferrous accelerator selected from the group of a complexing agent for complexing the nonferrous metal and a water-soluble polymer containing an acrylic acid functional group.

Preferably, the solution contains 0.02 to 2 weight percent complexing agent for the nonferrous metal. Most preferably, the solution contains 0.05 to 1 weight percent complexing agent for the nonferrous metal. Typical complexing agents include at least one of carboxylic acids, multi-carboxylic acids, aminocarboxylic acids, multi-amine compounds and mixtures thereof. Specific complexing agents include the following: acetic acid, alanine, aspartic acid, ethyl acetoacetate, ethylene diamine, trimethylene diamine, ethylenediaminetetraacetic acid (EDTA), citric acid, lactic acid, malic acid, maleic acid, malonic acid, oxalic acid, triethylenetetramine, diethylene triamine, glycine, glycolic acid, gluteric acid, salicylic acid, nitrilotriacetic acid, ethylenediamine, hydroxyethylenethylenediaminetetraacetic acid, hydroxyqunoline, tartaric acid, sodium diethyl dithiocarbamate, succinic acid, sulfosalicylic acid, triglycolic acid thioglycolic acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, gallic acid, tannic acid, salts thereof and mixtures thereof. Some organic acids, such as citric acid may serve as both a complexing agent and a pH adjusting agent. The complexing agent also provides the advantage of controlling the discoloration of the polishing solution during aging. Adding the complexing agent accelerates copper removal, but excessive complexing agent can adversely impact polishing rate.

An amount of 10 parts per billion (ppb) to 4 weight percent complexing agent can control the discoloration of the polishing solution. Insufficient complexing agent can result in unstable polishing slurries (polishing slurries that undergo a color change within too short a time period); and excessive complexing agent can adversely impact polishing rate.

Preferably the solution contains a water-soluble polymer having an acrylic acid functional group for increasing the removal rate of the nonferrous interconnect metal. For example, polyacrylic acid, polymethacrylic acid, copolymers thereof and mixtures thereof are particularly effective for incrementally increasing copper removal rate. For example, an addition of 0.0005 to 5 weight percent water-soluble polymer can serve to increase the nonferrous interconnect metal rate to an acceptable level. Preferably, the solution contains 0.001 to 3 weight percent water-soluble polymer. Most preferably, the solution contains 0.002 to 3 weight percent water-soluble polymer. The water-soluble polymer has a number average molecular weight between 100 and 1,000,000. This specification defines all molecular weights in terms of number average molecular weight as determined by gel permeation chromatography. Preferably, the water-soluble polymer has a number average molecular weight between 100 and 750,000. Most preferably, the water-soluble polymer has a number average molecular weight between 100 and 500,000. Within these ranges, copolymers operate best at the high ends of the ranges.

In addition, the water-soluble polymer preferably includes an amine functional group, such as poly(acryliamide-co-acrylic) acid to limit impact upon TEOS removal rate. For purposes of this specification, TEOS represents the silica dielectric formed from tetraethyl orthosilicate. The amine functional groups are particularly important when the solution contains an ammonium salt. If the water-soluble polymer is not a copolymer, then low molecular weight polymers are preferable. For example, polyacrylic acid, polymethacrylic acid and mixtures thereof having a number average molecular weight of 100 to 50,000 are particularly effective for incrementally increasing copper removal rate without substantially impacting TEOS removal rate. Preferably, the polyacrylic acid, polymethacrylic acid or mixture thereof has a number average molecular weight of 100 to 20,000. Most preferably, the polyacrylic acid, polymethacrylic acid or mixture thereof has a number average molecular weight of 100 to 10,000.

The barrier metal polishing composition optionally includes an abrasive for "mechanical" removal of the barrier material. The CMP composition includes an abrasive for "mechanical" removal of barrier layers. The abrasive is preferably a colloidal abrasive. Example abrasives include the following: inorganic oxide, metal boride, metal carbide, metal hydroxide, metal nitride, or a combination comprising at least one of the foregoing abrasives. Suitable inorganic oxides include, for example, silica ($SiO_2$), alumina ($Al_2O_3$), zirconia ($ZrO_2$), ceria ($CeO_2$), manganese oxide ($MnO_2$), and mixtures thereof. Alumina is available in many forms such as alpha-alumina, gamma-alumina, delta-alumina, and amorphous (non-crystalline) alumina. Other suitable examples of alumina are boehmite (AlO(OH)) particles and mixtures thereof. Modified forms of these inorganic oxides such as polymer-coated inorganic oxide particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, and mixtures comprising at least one of the foregoing metal carbides, boride and nitrides. Diamond may also be utilized as an abrasive if desired. Alternative abrasives also include polymeric particles and coated polymeric particles. The preferred abrasive is silica.

The abrasive has a concentration in the aqueous phase of the polishing composition of 0 to 50 weight percent. For abrasive-free solutions, a fixed abrasive pad assists with the removal of the barrier layer. Preferably, the abrasive concentration is 0.1 to 40 weight percent. And most preferably, the abrasive concentration is 0.25 to 35 weight percent. Typically, increasing abrasive concentration increases the removal rate of dielectric materials; and it especially increases the removal rate of low-k dielectric materials, such as carbon-doped oxide. For example, if a semiconductor manufacturer desires an increased low-k dielectric removal rate, then increasing the abrasive content can increase the dielectric removal rate to the desired level.

The abrasive preferably has an average particle size of less than 250 nm for preventing excessive metal dishing and dielectric erosion. For purposes of this specification, particle size refers to the colloidal silica's average particle size. Most preferably, the silica has an average particle size of less than 100 nm to further reduce metal dishing and dielectric erosion. In particular, an average abrasive particle size less than 15 nm removes the barrier metal an acceptable rate without excessive removal of the dielectric material. For example, the least dielectric erosion and metal dishing occur with a colloidal silica having an average particle size is 2 to 15 nm. Decreasing the size of the colloidal silica tends to improve the selectivity of the solution; but it also tends to decrease the barrier removal rate. In addition, the preferred colloidal silica may include additives, such as dispersants to improve the stability of the silica at acidic pH ranges. One such abrasive is colloidal silica that is available from Clariant S.A., of Puteaux, France.

In addition, high purity silica particles also serve to decrease the aging or yellowing rate of the polishing solutions. For example maintaining total transition metal concentration to less than 1 part per million (ppm) further increases the solution's ability to decrease yellowing. Furthermore, limiting potassium and sodium to less than 1 ppm reduces adverse diffusion of these detrimental components into dielectric layers.

Optionally, the removal rate of barrier layers, such as tantalum, tantalum nitride, titanium and titanium nitride is preferably optimized by the use of an oxidizing agent. Suitable oxidizers include, for example, hydrogen peroxide, monopersulfates, iodates, magnesium perphthalate, peracetic acid and other peracids, persulfates, bromates, periodates, nitrates, iron salts, cerium salts, manganese (Mn) (III), Mn (IV) and Mn (VI) salts, silver salts, copper salts, chromium salts, cobalt salts, halogens, hypochlorites, or combinations comprising at least one of the foregoing oxidizers. The preferred oxidizer is hydrogen peroxide. It is to be noted that the oxidizer is typically added to the polishing composition just prior to use and in these instances the oxidizer is contained in a separate package.

It is desirable to use an amount of 0 to 20 weight percent oxidizer. Preferably, the oxidizer is 0.001 to 15 weight percent. Most preferably, the composition contains 0.05 to 10 weight percent oxidizer. Adjusting the amount of oxidizer, such as peroxide can also control the metal interconnect removal rate. For example, increasing the peroxide concentration increases the copper removal rate. Excessive increases in oxidizer, however, provide an adverse impact upon polishing rate.

Additionally, the solution contains at least 0.001 weight percent inhibitor to control nonferrous interconnect removal rate by static etch or other removal mechanism. Adjusting the concentration of an inhibitor adjusts the nonferrous interconnect metal removal rate by protecting the metal from static etch. Preferably, the solution contains 0.001 to 10 weight percent inhibitor for inhibiting static etch of nonferrous metal, for example, copper interconnects. Most preferably, the solution contains 0.05 to 2 weight percent inhibitor. The inhibitor may consist of a mixture of inhibitors. Azole inhibitors are particularly effective for copper and silver interconnects. Typical azole inhibitors include benzotriazole (BTA), mercaptobenzothiazole (MBT), tolytriazole and imidazole. BTA is a particularly effective inhibitor for copper and silver interconnects.

The polishing composition has a pH of less than 7 and a balance water. Preferably, the pH is less than or equal to 5. Optionally, the polishing composition includes an inorganic pH adjusting agent to reduce the pH of the polishing composition to an acidic pH less than 7 with a balance water. Preferably, the pH adjusting agent only contains an impurity level concentration of metallic ions. In addition, the solution most preferably relies upon a balance of deionized water to limit incidental impurities. The pH adjusting agent can be either an organic or inorganic acid. Example organic acids include at least one of acetic acid, citric acid, malic acid, maleic acid, glycolic acid, phthalic acid, oxalic acid, malonic acid, lactic acid, succinic acid, tartaric acid and mixtures thereof. Preferably, the pH adjusting agent is an inorganic acid, such as nitric acid, sulfuric acid, hydrochloric acid, hydrofluoric acid and phosphoric acid. The most advantageous pH adjusting agent is nitric acid ($HNO_3$). Typically, the solution has a pH of 1.5 to 5. Most preferably, the pH is 2 to 4.

At a pH below 5, the polishing composition can provide a high barrier metal removal rate, even with a relatively low abrasive concentration. This low abrasive concentration can improve the polishing performance of a CMP process by reducing undesired abrasive induced defects, such as scratching. In addition, at a pH below 4, the polishing composition can be formulated with abrasive particles having a relatively small particle size. For example, a particle size of as small as approximately 10 nm still provides an acceptable Ta/TaN removal rate. By employing an abrasive having a relatively small particle size and formulating the acidic polishing composition at a low abrasive concentration, polishing defects are reduced to excellent levels.

In addition, the optional addition of ammonium salts facilitates controlled removal rate of silicon oxide-containing layers, such as TEOS layers at acidic pH levels; and thus they permit controlling the silicon oxide-containing material's removal rate. The ammonium salts are organic ammonium salts formed with compounds to include the structure:

$R_1$, $R_2$, $R_3$ and $R_4$ are radicals that can be the same or different. The composition operates at acidic pH levels where the ammonium compound becomes ionized. Example anions include, nitrate, sulfate, halides (such as, bromide, chloride, fluoride and iodide), citrate, phosphate, oxalate, malate, gluconate, hydroxide, acetate, borate, lactate, thiocyanate, cyanate, sulfonate, silicate, per-halides (such as, perbromate, perchlorate and periodate), chromate, and mixtures thereof. It is possible to add the salt directly to the composition or to form the salt in situ. For example, adding tetrabutylammonium hydroxide (TBAH) to a nitric acid solution at a pH of 2.5 forms the tetrabutylammonium nitrate.

A preferable ammonium salt combination is that formed from reacting tetrabutylammonium hydroxide with hydrofluoric acid. This combination reacts at low pH levels to form a tetrabutylammonium fluoride salt. Although the exact mechanism is unclear (the fluoride salt dissociates to provide fluoride ions in solution), having organic ammonium fluoride salts in solution further accelerates the TEOS removal rate.

$R_1$ is an organic that has a carbon chain length of 2 to 15 carbon atoms. More preferably, $R_1$ has a carbon chain length of 2 to 10. Most preferably, $R_1$ has a carbon chain length of 2 to 5 carbon atoms. The organic of $R_1$ may be a substituted or unsubstituted aryl, alkyl, aralkyl, or alkaryl group.

Preferably, $R_2$, $R_3$ and $R_4$ are organic compounds, such as, a substituted or unsubstituted aryl, alkyl, aralkyl, or alkaryl group; or hydrogen. If $R_2$, $R_3$ or $R_4$ is an organic compound, then the organic compound preferably has a carbon chain length of 2 to 15 carbon atoms; more preferably, it has a carbon chain length of 2 to 10 carbon atoms; and most preferably, it has a carbon chain length of 2 to 5 carbon atoms.

Suitable compounds for forming ammonium salts include tetraethyl ammonium, tetrabutylammonium, benzyltributylammonium, benzyltrimethylammonium, benzyltriethylammonium, diallyldimethylammonium, diethylaminoethyl methacrylate, dimethylaminoethyl methacrylate, methacryloyloxyethyltrimethylammonium, 3-(methacrylamido) propyltrimethylammonium, triethylenetetramine, tetramethylguanidine, hexylamine and mixtures thereof. Specific ammonium salts include tetraethyl ammonium nitrate, tetrabutylammonium fluoride, tetraethylammonium nitrate, tetraethylammonium fluoride, benzyltributylammonium chloride, benzyltrimethylammonium chloride, benzyltriethylammonium chloride, diallyldimethylammonium chloride, diallyldiethylammonium chloride, diethylaminoethyl methacrylate, dimethylaminoethyl methacrylate, methacryloyloxyethyltrimethylammonium sulfate, methacryloyloxyethyltrimethylammonium chloride, 3-(methacrylamido) propyltrimethylammonium chloride, triethylenetetramine, tetramethylguanidine, hexylamine and mixtures comprising at least one of the foregoing. The preferred ammonium salts are tetraethyl ammonium salts, tetrabutylammonium salts, benzyltributylammonium salts, benzyltrimethylammonium salts, benzyltriethylammonium salts and mixtures thereof.

The ammonium salts are present in an amount of 1 ppm to 4 weight percent Preferably, the ammonium salt is present in an amount of 10 ppm to 2 weight percent. Most preferably, the ammonium salt is 25 ppm to 1 weight percent.

The solution enables the CMP apparatus to operate with a low pad pressure, for example at 7.5 to 25 kPa and, in certain cases, even below 7.5 kPa. The low CMP pad pressure improves polishing performance by reducing scratching and other undesired polish defects and decreases damage to fragile materials. For example, low dielectric constant materials fracture and delaminate, if exposed to high compressive forces. Further, the high barrier metal removal rate obtained by the acidic polishing solution enables effective barrier metal polishing using a low abrasive concentration and a small particle size.

For purposes of this specification, useful for preferentially removing barrier materials in the presence of nonferrous interconnect metals refers to removing the barrier material at a rate, as expressed in Angstroms per minute, of greater than the removal rate of the interconnect metal. Typically, the polishing solution has a tantalum nitride to copper selectivity of at least 1 to 1 as measured with a polishing pad pressure measured normal to a wafer less than 15 kPa. Preferably, the polishing solution has a tantalum nitride to copper selectivity of at least 1.5 to 1 as measured with a polishing pad pressure measured normal to a wafer less than 15 kPa. Most preferably, the polishing solution has a tantalum nitride to copper selectivity of at least 2 to 1. A specific example for testing the selectivity is the conditions, including the polyurethane polishing pad, of Example 3. This high level of selectivity allows a chip manufacturer to remove the barrier material without removing excess dielectric or interconnect material.

For purposes of this specification, limited dielectric erosion refers to a chemical mechanical polishing process where after polishing, the dielectric has sufficient thickness to act on behalf of its intended purpose, such as being a semiconducting, masking or barrier material. In addition, the polishing solution provides a flexible tantalum nitride to dielectric selectivity. For example, the polishing solution has a tantalum nitride to TEOS selectivity of 1 to 2 to as high as 10 to 1 as measured with a polishing pad pressure measured normal to a wafer less than 15 kPa. A specific example for testing the selectivity is the conditions of Example 3, including the polyurethane polishing pad.

The polishing composition can also optionally include buffering agents such as various organic and inorganic acids, and amino acids or their salts with a pKa in the pH range of 1.5 to less than 4. The polishing composition can further optionally include defoaming agents, such as non-ionic surfactants including esters, ethylene oxides, alcohols, ethoxylate, silicon compounds, fluorine compounds, ethers, glycosides and their derivatives, and the like. The defoaming agent can also be an amphoteric surfactant. The polishing composition may optionally contain biocides, such as Kathon® ICP III, containing active ingredients of 2-methyl-4-isothiazolin-3-one and 5-chloro-2-methyl-4-isothiazolin-3-one (Kathon is a registered trademark of Rohm and Haas Company).

EXAMPLES

Example 1

A list of solution compositions shown in Table 1 were prepared to evaluate the performance of malic acid and polyacrylic acid at varying concentration levels. In the preparation of the compositions the requisite amounts of all required chemicals as shown in Table 1 (with the exception of the hydrogen peroxide and the abrasive) were added to deionized water in a container. The solution in the container was stirred until all the ingredients are dissolved in water. The abrasive was then added to the container. The pH of the solution was then adjusted to the target pH by the addition of nitric acid. Following this, the hydrogen peroxide was added to the container for use as a polishing composition. For purposes of this specification, letters represent comparative examples and numbers represent examples of the invention. Comparative slurries A-F, without any copper removal agents, were used as a control.

TABLE 1

| Slurry | BTA (wt %) | TBAH (wt %) | EDTA (wt %) | Poly(acrylic) acid, M.W. 1800 (wt %) | Poly(acrylic) acid, M.W. 30,000 (wt %) | Malic acid (wt %) | Silica (wt %) | $H_2O_2$ (wt %) | pH |
|---|---|---|---|---|---|---|---|---|---|
| A | 0.6 | 0.085 | 0.00154 | | | | 4 | 0.6 | 2.6 |
| B | 0.6 | 0.085 | 0.00154 | | | | 4 | 1 | 2.6 |
| C | 0.6 | 0.085 | 0.00154 | | | | 4 | 2 | 2.6 |
| D | 0.6 | 0.085 | 0.00154 | | | | 4 | 3.5 | 2.6 |
| E | 0.6 | 0.085 | 0.00154 | | | | 4 | 4.5 | 2.6 |
| F | 0.6 | 0.085 | 0.00154 | | | | 4 | 6.5 | 2.6 |
| 1 | 0.6 | 0.085 | 0.00154 | | | 0.2 | 4 | 0.6 | 2.6 |
| 2 | 0.6 | 0.085 | 0.00154 | | | 0.2 | 4 | 2 | 2.6 |
| 3 | 0.6 | 0.085 | 0.00154 | | | 0.2 | 4 | 3.5 | 2.6 |
| 4 | 0.6 | 0.085 | 0.00154 | | | 0.2 | 4 | 4.5 | 2.6 |
| 5 | 0.6 | 0.085 | 0.00154 | | | 0.2 | 4 | 6 | 2.6 |
| 6 | 0.6 | 0.085 | 0.00154 | | | 0.2 | 4 | 1 | 2.6 |
| 7 | 0.6 | 0.085 | 0.00154 | | | 0.2 | 4 | 2.5 | 2.6 |
| 8 | 0.6 | 0.085 | 0.00154 | 0.1 | | 0.2 | 4 | 0.3 | 2.6 |
| 9 | 0.6 | 0.085 | 0.00154 | 0.1 | | 0.2 | 4 | 0.6 | 2.6 |
| 10 | 0.6 | 0.085 | 0.00154 | 0.1 | | 0.2 | 4 | 1 | 2.6 |
| 11 | 0.6 | 0.085 | 0.00154 | 0.1 | | 0.2 | 4 | 1.5 | 2.6 |
| 12 | 0.6 | 0.085 | 0.00154 | 0.1 | | 0.2 | 4 | 2 | 2.6 |
| 13 | 0.6 | 0.085 | 0.00154 | 0.1 | | 0.2 | 4 | 3.5 | 2.6 |
| 14 | 0.6 | 0.085 | 0.00154 | 0.1 | | 0.2 | 4 | 4.5 | 2.6 |
| 15 | 0.6 | 0.085 | 0.00154 | 0.1 | | | 4 | 0.6 | 2.6 |
| 16 | 0.6 | 0.085 | 0.00154 | 0.1 | | 0.2 | 4 | 4 | 2.6 |
| 17 | 0.6 | 0.085 | 0.00154 | 0.1 | | 0.2 | 4 | 9 | 2.6 |
| 18 | 0.6 | 0.085 | 0.00154 | | 0.1 | | 4 | 0.6 | 2.6 |
| 19 | 0.6 | 0.085 | 0.00154 | | 0.1 | 0.2 | 4 | 0.6 | 2.6 |
| 20 | 0.6 | 0.085 | 0.00154 | | 0.1 | 0.2 | 4 | 1 | 2.6 |
| 21 | 0.6 | 0.085 | 0.00154 | | 0.1 | 0.2 | 4 | 2 | 2.6 |
| 22 | 0.6 | 0.085 | 0.00154 | | 0.1 | 0.2 | 4 | 4 | 2.6 |
| 23 | 0.6 | 0.085 | 0.00154 | | 0.1 | 0.2 | 4 | 9 | 2.6 |

BTA = benzotriazole;
EDTA = ethylenediaminetetraacetic acid;
Poly(acrylic) acid had number average molecular weight of 1800 or 30,000;
silica was PL150H25 from Clariant having an average particle size of 25 nm; and all slurries contained a balance distilled water.

The polishing example was performed using a Mirra® model polishing tool manufactured by Applied Materials. The polishing pad was an IC1010™ porous polyurethane pad supplied by Rohm and Haas Electronic Materials CMP Technologies. The pad was conditioned prior to each run with a diamond abrasive plate manufactured by Kinik having 180 μm diamonds. The polishing process was performed at a membrane pressure of 10.33 kPa (1.5 psi), a table speed of 93 revolutions per minute (rpm) and a carrier speed of 87 rpm. The polishing composition supply rate was 200 ml/min using 200 mm blanket wafers from ATDF, Inc. Cu and TaN removal rates were measured on a Four-Point Probe CDE Resmap. Copper, TaN, TEOS and Coral® carbon-doped oxide (CDO) film removal rates were measured by a ThermaWave Optiprobe® 2600 metrology tool and an Orbot™ WF-720 from Applied Materials measured defectivity. Table 2 below provides the polishing results.

TABLE 2

| Slurry | Poly(acrylic) acid, M.W. 1800 (wt %) | Malic acid (wt %) | $H_2O_2$ (wt %) | Cu RR (Å/min) | TaN RR (Å/min) | TEOS RR (Å/min) | CDO RR (Å/min) | Defects |
|---|---|---|---|---|---|---|---|---|
| A | | | 0.6 | 95 | 1431 | 850 | 142 | 356 |
| B | | | 1 | 116 | | | | 210 |
| C | | | 2 | 124 | | | | 167 |
| D | | | 3.5 | 392 | | | | 27879 |
| E | | | 4.5 | 415 | | | | 26562 |
| F | | | 6.5 | 86 | | | | 21518 |
| 1 | | 0.2 | 0.6 | 75 | 1469 | 778 | 96 | 147 |
| 2 | | 0.2 | 2 | 141 | 1524 | 783 | 95 | 179 |
| 3 | | 0.2 | 3.5 | 634 | 1619 | 750 | 105 | 62 |
| 4 | | 0.2 | 4.5 | 1069 | 1493 | 742 | 114 | 53 |
| 5 | | 0.2 | 6 | 1081 | 4908 | 757 | 120 | 48 |
| 6 | | 0.2 | 1 | 95 | 1503 | 747 | 95 | 168 |
| 7 | | 0.2 | 2.5 | 154 | 1514 | 736 | 96 | 178 |
| 8 | 0.1 | 0.2 | 0.3 | 275 | 1286 | 652 | 109 | 133 |
| 9 | 0.1 | 0.2 | 0.6 | 320 | 1447 | 672 | 107 | 109 |
| 10 | 0.1 | 0.2 | 1 | 350 | 1469 | 644 | 102 | 180 |

TABLE 2-continued

| Slurry | Poly(acrylic) acid, M.W. 1800 (wt %) | Malic acid (wt %) | $H_2O_2$ (wt %) | Cu RR (Å/min) | TaN RR (Å/min) | TEOS RR (Å/min) | CDO RR (Å/min) | Defects |
|---|---|---|---|---|---|---|---|---|
| 11 | 0.1 | 0.2 | 1.5 | 390 | 1465 | 664 | 103 | 81 |
| 12 | 0.1 | 0.2 | 2 | 459 | 1480 | 670 | 104 | 91 |
| 13 | 0.1 | 0.2 | 3.5 | 548 | 1475 | 645 | 108 | 143 |
| 14 | 0.1 | 0.2 | 4.5 | 1116 | 1466 | 639 | 102 | 67 |

CDO = CORAL carbon-doped oxide from Novellus Systems, Inc.

Figure 1:
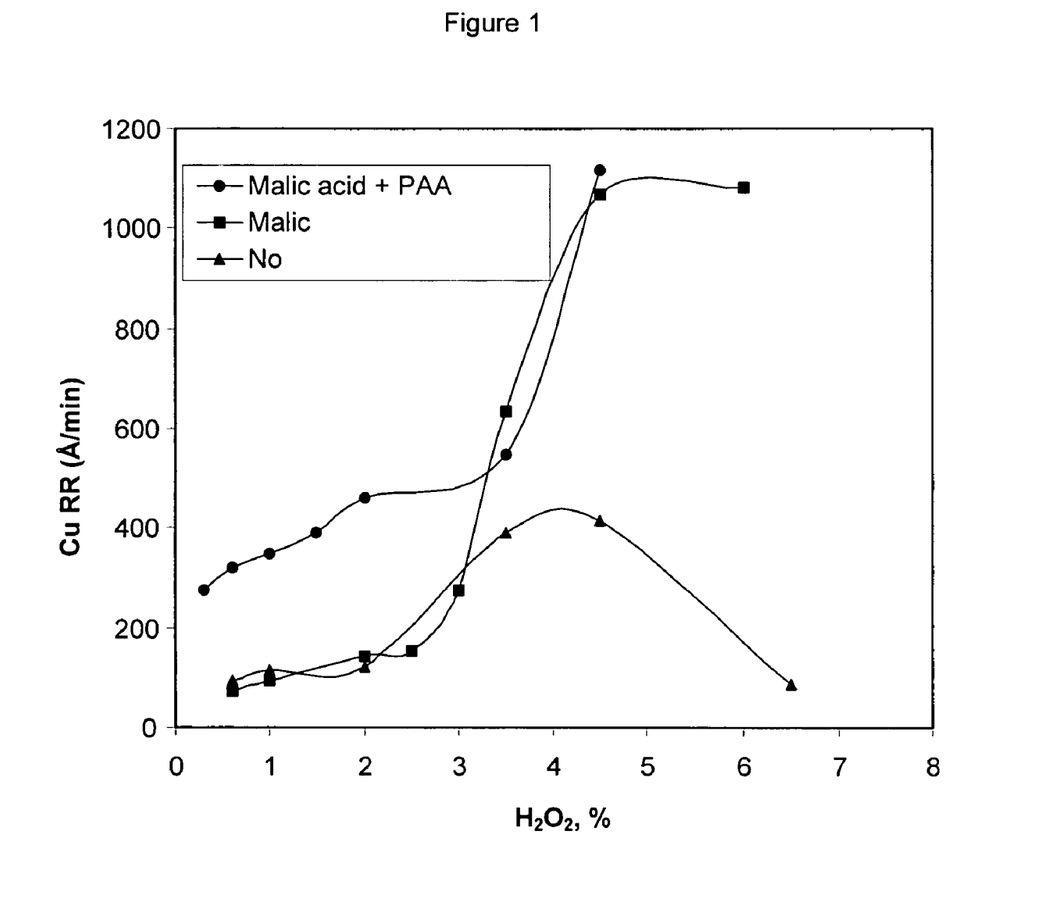
FIG. 1 is a plot of copper removal rate in Angstroms per minute against hydrogen peroxide concentration (wt %) for slurries containing, no additive, malic acid and malic acid with polyacrylic acid.
Figure 2:
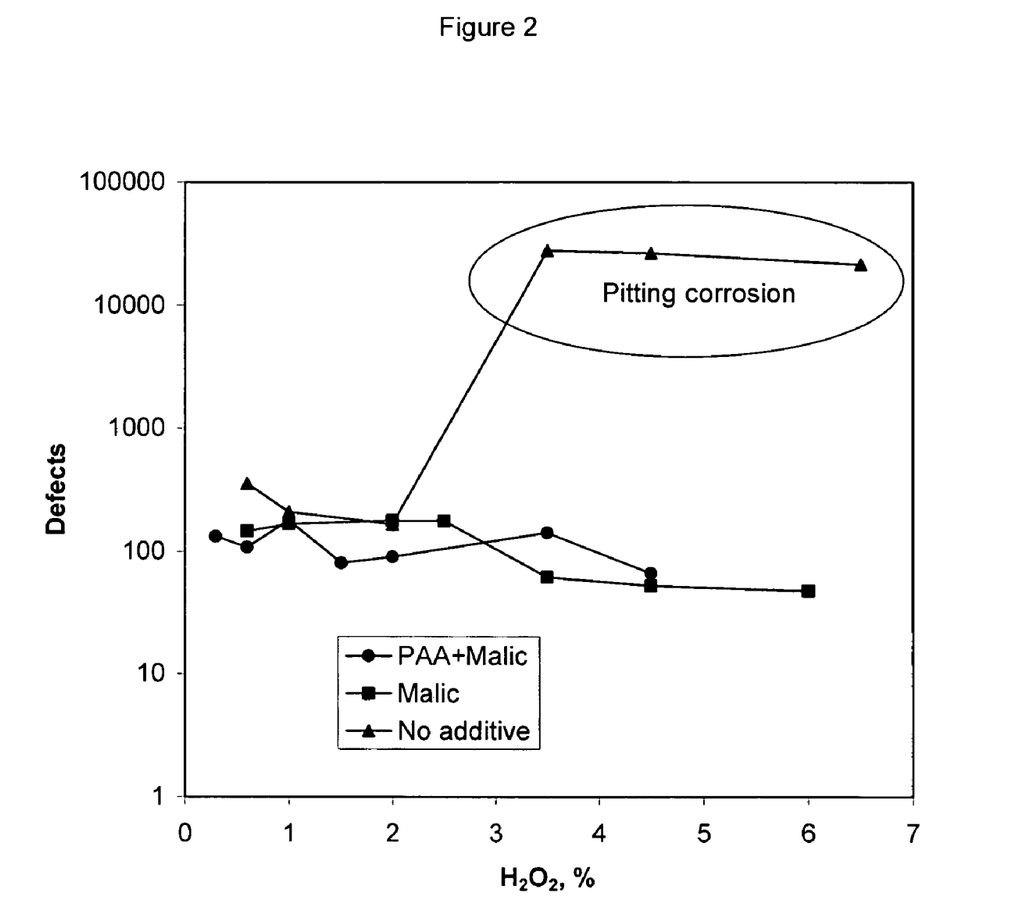
FIG. 2 is a plot of defects versus peroxide concentration (wt %) for slurries containing, no additive, malic acid and malic acid with polyacrylic acid.

Table 2, as illustrated in FIG. 1, indicates that malic acid accelerates copper removal at high peroxide levels (>3 wt %) and that polyacrylic acid further increases removal rates at low peroxide levels (<3 wt %). In addition, FIG. 2 illustrates that both malic acid and polyacrylic acid limit the defects associated with copper pitting corrosion. In addition, subsequent testing on patterned wafers has also shown a similar decrease in defectivity for additions of polyacrylic acid polymer with malic acid at high hydrogen peroxide levels.

Example 2

This Example compares the removal rate effectiveness for polyacrylic acid having two different molecular weights and various hydrogen peroxide levels using the slurries and conditions of Example 1.

TABLE 3

| Slurry | Poly(acrylic) acid, M.W. 1,800 (wt %) | Poly(acrylic) acid, M.W. 30,000 (wt %) | Malic acid (wt %) | $H_2O_2$ (wt %) | Cu RR (Å/min) | TaN RR (Å/min) | TEOS RR (Å/min) |
|---|---|---|---|---|---|---|---|
| A | | | | 0.6 | 61 | 1496 | 1076 |
| 15 | 0.1 | | | 0.6 | 166 | 1085 | |
| 9 | 0.1 | | 0.2 | 0.6 | 160 | 1344 | 900 |
| 10 | 0.1 | | 0.2 | 1 | 188 | 1371 | |
| 12 | 0.1 | | 0.2 | 2 | 332 | 1499 | |
| 16 | 0.1 | | 0.2 | 4 | 359 | 1547 | |
| 17 | 0.1 | | 0.2 | 9 | 1642 | 1435 | |
| 18 | | 0.1 | | 0.6 | 121 | 894 | 349 |
| 19 | | 0.1 | 0.2 | 0.6 | 125 | 1112 | 409 |
| 20 | | 0.1 | 0.2 | 1 | 138 | 942 | |
| 21 | | 0.1 | 0.2 | 2 | 201 | 1093 | |
| 22 | | 0.1 | 0.2 | 4 | 354 | 1102 | |
| 23 | | 0.1 | 0.2 | 9 | 1111 | 1389 | |

Table 3 illustrates that low molecular weight polyacrylic acid (1,800 number average molecular weight) and high molecular weight polyacrylic acid (30,000 number average molecular weight) each increase copper removal rate. The low molecular weight polyacrylic acid, however, has less negative effect on TEOS removal rate than high molecular weight polyacrylic acid.

Example 3

The polishing was performed using Strausbaugh 6EC polishing tool. The polishing pad was a POLITEXυ porous polyurethane pad supplied by Rohm and Haas Electronic Materials CMP Technologies. The pad was conditioned prior to each run with a diamond abrasive plate manufactured by Kinik having 180 μm diamonds. The polishing process was performed at a membrane pressure of 10.33 kPa (1.5 psi), a table speed of 93 revolutions per minute (rpm) and a carrier speed of 87 rpm. The polishing composition apply rate was 200 ml/min using 200 mm blanket wafers. Cu and TaN removal rates were measured on a Four-Point Probe CDE Resmap. TEOS and Coral® carbon-doped oxide (CDO) film removal rates were measured by a ThermaWave Optiprobe® 2600 metrology tool.

Table 4 below provides barrier slurries compositions with a poly(acryliamide-co-acrylic) acid copolymer and polyacrylic acid with various amounts of hydrogen peroxide.

TABLE 4

| Slurry | BTA (wt %) | TBAH (wt %) | Poly(acryliamide-co-acrylic acid) M.W. 200,000 (wt %) | Poly(acrylic) acid, M.W. 1800 (wt %) | EDTA (wt %) | Malic acid (wt %) | Silica (wt %) | $H_2O_2$ (wt %) | pH |
|---|---|---|---|---|---|---|---|---|---|
| G | 0.2 | 0.085 | | | 0.00154 | | 4 | 0.6 | 2.6 |
| 24 | 0.2 | 0.085 | 0.01 | | 0.00154 | 0.2 | 4 | 0.6 | 2.6 |

TABLE 4-continued

| Slurry | BTA (wt %) | TBAH (wt %) | Poly(acryli-amide-co-acrylic acid) M.W. 200,000 (wt %) | Poly(acrylic) acid, M.W. 1800 (wt %) | EDTA (wt %) | Malic acid (wt %) | Silica (wt %) | $H_2O_2$ (wt %) | pH |
|---|---|---|---|---|---|---|---|---|---|
| 25 | 0.2 | 0.085 | 0.01 |  | 0.00154 | 0.2 | 4 | 1 | 2.6 |
| 26 | 0.2 | 0.085 | 0.01 |  | 0.00154 | 0.2 | 4 | 2 | 2.6 |
| 27 | 0.2 | 0.085 | 0.01 |  | 0.00154 | 0.2 | 4 | 4 | 2.6 |
| 28 | 0.2 | 0.085 |  | 0.1 | 0.00154 | 0.2 | 4 | 0.6 | 2.6 |
| 29 | 0.2 | 0.085 |  | 0.1 | 0.00154 | 0.2 | 4 | 1 | 2.6 |
| 30 | 0.2 | 0.085 |  | 0.1 | 0.00154 | 0.2 | 4 | 2 | 2.6 |
| 31 | 0.2 | 0.085 |  | 0.1 | 0.00154 | 0.2 | 4 | 4 | 2.6 |

BTA = benzotriazole;
EDTA = ethylenediaminetetraacetic acid;
Poly(acryliamide-co-acrylic) acid and Poly(acrylic) acid had number average molecular weight of 200,000 and 1,800, respectively;
silica was PL150H25 from Clariant having an average particle size of 25 nm; and all slurries contained a balance distilled water.

Tables 5 below provides the polishing results.

TABLE 5

| Slurry | Poly(acryli-amide-co-acrylic acid) M.W. 200,000 (wt %) | Poly(acrylic) acid, M.W. 1800 (wt %) | $H_2O_2$ (wt %) | TEOS RR (Å/min) | Cu RR (Å/min) |
|---|---|---|---|---|---|
| G |  |  | 0.6 | 860 | 122 |
| 24 | 0.01 |  | 0.6 | 899 | 303 |
| 25 | 0.01 |  | 1 | 885 | 364 |
| 26 | 0.01 |  | 2 | 851 | 393 |
| 27 | 0.01 |  | 4 | 846 | 819 |
| 28 |  | 0.1 | 0.6 | 670 | 352 |
| 29 |  | 0.1 | 1 | 684 | 387 |
| 30 |  | 0.1 | 2 | 675 | 426 |
| 31 |  | 0.1 | 4 | 656 | 688 |

Table 5 illustrates that the poly(acryliamide-co-acrylic) acid copolymer increase copper removal rate with less of an decrease in TEOS removal rate than polyacrylic acid.

In summary, the combination provides a low-pH polishing solution with excellent tantalum barrier removal, controlled copper removal and limited copper corrosion. This improved stability facilitates increased wafer yields by providing a polishing solution with predictable polishing performance over time. Furthermore, it possesses both a rapid removal of barrier materials, excellent selectivity to interconnect metals, excellent wafer defectivity and controlled removal rate of copper and dielectric materials. Optionally, an organic-containing ammonium salt may increase the TEOS removal rate, abrasive particles increase low-k dielectric removal rate and the complexing agent and acrylic acid polymer control the copper removal rate to provide polishing solutions adaptable for several integration schemes.

The invention claimed is:

1. A polishing solution useful for removing barrier materials in the presence of at least one nonferrous interconnect metal with limited erosion of dielectrics comprising: 0 to 20 weight percent oxidizer, at least 0.001 weight percent inhibitor for reducing removal rate of the nonferrous interconnect metals, 0.0005 to 5 weight percent of at least one nonferrous accelerator selected from the group of a complexing agent for complexing the nonferrous metal and a water-soluble copolymer containing an acrylic acid functional group and having a number average molecular weight of 100 to 1,000,000, 1 ppm to 4 weight percent organic-containing ammonium salt formed with wherein $R_1$, $R_2$, $R_3$ and $R_4$ are radicals, $R_1$ has a carbon chain length of 2 to 15 carbon atoms, 0 to 50 weight percent abrasive and balance water; and the solution having a pH of less than 7.

2. The polishing solution of claim 1 wherein the solution contains a complexing agent selected from at least one of at least one of carboxylic acids, multi-carboxylic acids, aminocarboxylic acids, multi-amine compounds and mixtures thereof.

3. The polishing solution of claim 1 wherein the solution contains a complexing agent selected from at least one of at least one of acetic acid, alanine, aspartic acid, ethyl acetoacetate, ethylene diamine, trimethylene diamine, ethylenediaminetetraacetic acid (EDTA), citric acid, lactic acid, malic acid, maleic acid, malonic acid, oxalic acid, triethylenetetramine, diethylene triamine, glycine, glyolic acid, gluteric acid, salicylic acid, nitrilotriacetic acid, ethylenediamine, hydroxyethylenethylenediaminetetraacetic acid, hydroxyqunoline, tartaric acid, sodium diethyl dithiocarbamate, succinic acid, sulfosalicylic acid, triglycolic acid thioglycolic acid, 3-hydroxybutyric acid, pronionic acid, phthalic acid, isophthalic acid, 3-hydroxy salicylic acid, 3,5-dihydroxy salicylic acid, gallic acid, gluconic acid pyrocatechol, pyrogallol, gallic acid, tannic acid, salts thereof and mixtures thereof.

4. The polishing solution of claim 2 wherein the water-soluble copolymer contains poly(acryliamide-co-acrylic) acid copolymer.

5. A polishing solution, useful for removing barrier materials in the presence of at least one nonferrous interconnect metal with limited erosion of dielectrics comprising: 0.001 to 15 weight percent oxidizer, at least 0.001 weight percent inhibitor for reducing removal rate of the nonferrous interconnect metals, 0.001 to 3 weight percent of a water-soluble poly(acryliamide-co-acrylic) acid copolymer having a number average molecular weight of 100 to 750,000, 1 ppm to 4 weight percent organic-containing ammonium salt formed with wherein $R_1$, $R_2$, $R_3$, and $R_4$, are radicals, $R_1$ has a carbon chain length of 2 to 15 carbon atoms, 0 to 50 weight percent abrasive and balance water; and the solution having a pH of less than 5.

6. The polishing solution of claim 5 wherein the number average molecular weight of the water-soluble poly(acrylamide-co-acrylic) acid copolymer is 100 to 10,000.

7. The polishing solution of claim 5 wherein the animonium salt is formed with at least one of tetraethyl ammonium, tetrabutylammonium, benzyltributylammonium, benzyltrimethylammonium, benzyltriethylammonium, diallyldimethylammonium, diethylaminoethyl methacrylate, dimethylaminoethyl methacrylate, methacryloyloxyethyltrimethylammonium, 3-(methacrylamido) propyltrimethylammonium, triethylenetetramine, tetramethylguanidine, hexylamine and mixtures thereof.

8. The polishing solution of claim 5 wherein the solution contains a complexing agent selected from at least one of at least one of carboxylic acids, multi-carboxylic acids, aminocarboxylic acids, multi-amine compounds and mixtures thereof.

9. The polishing solution of claim 5 wherein the solution contains complexing agent and the complexing agent includes at least one selected from acetic acid, alanine, aspartic acid, ethyl acetoacetate, ethylene diamine, trimethylene diamine, ethylenediaminetetraacetic acid (EDTA), citric acid, lactic acid, malic acid, maleic acid, malonic acid, oxalic acid, triethylenetetramine, diethylene triamine, glycine, glycolic acid, gluteric acid, sali cylic acid, nitrilotriacetic acid, ethylenediamine, hydroxyethylenethylenediaminetetraacetic acid, hydroxyqunoline, tartaric acid, sodium diethyl dithiocarbamate, succinic acid, sulfosalicylic acid, triglycolic acid thioglycolic acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, gallic acid, tannic acid, salts thereof and mixtures thereof.

* * * * *